US010778920B2

(12) United States Patent
Yamashita et al.

(10) Patent No.: US 10,778,920 B2
(45) Date of Patent: Sep. 15, 2020

(54) PHOTOELECTRIC CONVERSION APPARATUS AND CAMERA

(71) Applicant: CANON KABUSHIKI KAISHA, Tokyo (JP)

(72) Inventors: Takanori Yamashita, Hachioji (JP); Kazuhiro Saito, Tokyo (JP); Tatsuya Ryoki, Kawasaki (JP); Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 178 days.

(21) Appl. No.: 16/016,793

(22) Filed: Jun. 25, 2018

(65) Prior Publication Data

US 2018/0309950 A1 Oct. 25, 2018

Related U.S. Application Data

(63) Continuation of application No. 15/620,972, filed on Jun. 13, 2017, now Pat. No. 10,051,223.

(30) Foreign Application Priority Data

Jun. 30, 2016 (JP) ................................ 2016-131041

(51) Int. Cl.
*H04N 5/374* (2011.01)
*H04N 5/3745* (2011.01)
(Continued)

(52) U.S. Cl.
CPC ..... *H04N 5/37455* (2013.01); *H01L 27/1461* (2013.01); *H01L 27/14603* (2013.01);
(Continued)

(58) Field of Classification Search
CPC .. H04N 5/335; H04N 5/3745; H01L 27/1464; H01L 27/14636; H01L 2924/0002;
(Continued)

(56) References Cited

U.S. PATENT DOCUMENTS 7,903,056 B2 3/2011 Kawasaki et al.
7,907,196 B2 3/2011 Ogura et al.
(Continued)

FOREIGN PATENT DOCUMENTS

JP 2011-204797 A 10/2011
JP 2012-015276 A 1/2012
(Continued)

OTHER PUBLICATIONS

U.S. Appl. No. 15/630,013, filed Jun. 22, 2017 (First Named Inventor: Kazuhiro Saito).
(Continued)

*Primary Examiner* — Sinh Tran
*Assistant Examiner* — Selam T Gebriel
(74) *Attorney, Agent, or Firm* — Venable LLP

(57) ABSTRACT

A photoelectric conversion apparatus having a first substrate and a second substrate overlaid on each other and including electrically conductive portions is provided. The first substrate includes a photoelectric conversion element, a first portion configured to form part of a first surface, a second portion which is included in an electrically conductive pattern closest to the first portion, and a third portion which is included in an electrically conductive pattern second closest to the first portion. The second substrate includes a fourth portion configured to form part of a second surface, and a circuit. In a planar view with respect to the first surface, an area of the first portion is smaller than an area of the second portion and larger than an area of a portion of the third portion overlaying the second portion.

18 Claims, 5 Drawing Sheets

(51) Int. Cl.
*H01L 27/146* (2006.01)
*H04N 5/335* (2011.01)
*H04N 5/64* (2006.01)

(52) U.S. Cl.
CPC .. *H01L 27/14612* (2013.01); *H01L 27/14683* (2013.01); *H04N 5/335* (2013.01); *H04N 5/64* (2013.01)

(58) Field of Classification Search
CPC ........... H01L 2924/00; H01L 21/76886; H01L 23/485; H01L 27/1463; H01L 27/14643; H01L 27/14665; H01L 27/14806
See application file for complete search history.

(56) References Cited

U.S. PATENT DOCUMENTS

| | | | |
|---|---|---|---|
| 8,120,681 | B2 | 2/2012 | Ryoki et al. |
| 8,169,525 | B2 | 5/2012 | Ryoki et al. |
| 8,553,118 | B2 | 10/2013 | Saito et al. |
| 8,711,259 | B2 | 4/2014 | Maehashi et al. |
| 8,872,092 | B2 | 10/2014 | Ryoki et al. |
| 9,000,343 | B2 | 4/2015 | Ichikawa et al. |
| 9,083,906 | B2 | 7/2015 | Nakamura et al. |
| 9,252,169 | B2 | 2/2016 | Kobayashi et al. |
| 9,484,383 | B2 | 11/2016 | Kiyota et al. |
| 9,502,451 | B2 | 11/2016 | Yamashita et al. |
| 9,608,025 | B2 | 3/2017 | Ryoki |
| 2013/0092822 | A1 | 4/2013 | Ichikawa et al. |
| 2013/0284885 | A1* | 10/2013 | Chen ................ H01L 27/14621 250/208.1 |
| 2015/0076574 | A1* | 3/2015 | Shimotsusa ......... H01L 27/1463 257/292 |
| 2015/0076649 | A1 | 3/2015 | Kim et al. |
| 2016/0006967 | A1 | 1/2016 | Yamashita et al. |
| 2017/0064225 | A1 | 3/2017 | Yamazaki |
| 2017/0078603 | A1 | 3/2017 | Yamasaki et al. |

FOREIGN PATENT DOCUMENTS

| | | |
|---|---|---|
| JP | 2012-015277 A | 1/2012 |
| JP | 2012-256736 A | 12/2012 |
| JP | 2013-038112 A | 2/2013 |
| JP | 2014-107448 A | 6/2014 |

OTHER PUBLICATIONS

Office Action dated Jun. 29, 2020, in Japanese Patent Application No. 2016-131041.

* cited by examiner

PHOTOELECTRIC CONVERSION APPARATUS AND CAMERA

This is a continuation of U.S. patent application Ser. No. 15/620,972, filed Jun. 13, 2017.

BACKGROUND OF THE INVENTION

Field of the Invention

The present invention relates to a photoelectric conversion apparatus and a camera.

Description of the Related Art

Japanese Patent Laid-Open No. 2012-15277 proposes an image capturing apparatus formed by overlaying two substrates on each other. A pad is formed on one surface of each substrate, and the pads on both the substrates are brought into contact with each other, electrically connecting a circuit formed on one substrate and a circuit formed on the other substrate to each other.

SUMMARY OF THE INVENTION

Japanese Patent Laid-Open No. 2012-15277 does not describe the two-dimensional layouts of pads and a wiring layer. An aspect of the present invention provides a novel two-dimensional layout in a photoelectric conversion apparatus formed by overlaying two substrates on each other.

According to some embodiments, a photoelectric conversion apparatus in which a first substrate and a second substrate are overlaid on each other such that a first surface of the first substrate and a second surface of the second substrate are brought into contact with each other is provided. The first substrate includes a photoelectric conversion element, a first electrically conductive portion configured to form part of the first surface, a second electrically conductive portion which is included in an electrically conductive pattern closest to the first electrically conductive portion and is electrically connected to the first electrically conductive portion, and a third electrically conductive portion which is included in an electrically conductive pattern second closest to the first electrically conductive portion and to which a signal generated in the photoelectric conversion element is transmitted. The second substrate includes a fourth electrically conductive portion configured to form part of the second surface and electrically connected to the first electrically conductive portion, and a circuit electrically connected to the fourth electrically conductive portion and configured to process the signal generated in the photoelectric conversion element. In a planar view with respect to the first surface of the first substrate, an area of the first electrically conductive portion is smaller than an area of the second electrically conductive portion and larger than an area of a portion of the third electrically conductive portion overlaying the second electrically conductive portion.

Further features of the present invention will become apparent from the following description of exemplary embodiments (with reference to the attached drawings).

DESCRIPTION OF THE EMBODIMENTS

Figure 1A:
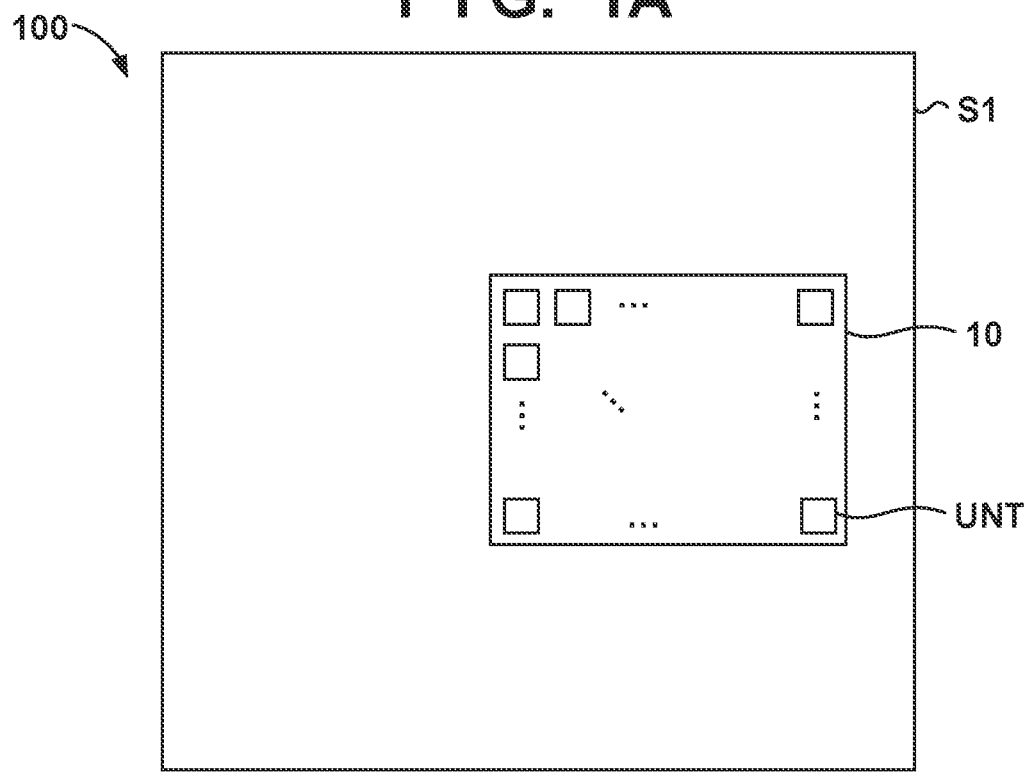
FIGS. 1A and 1B are block diagrams for explaining an example of the arrangement of an image capturing apparatus according to some embodiments.

Embodiments of the present invention will be described below with reference to the accompanying drawings. The same reference numerals denote the same elements throughout the various embodiments, and a repetitive explanation will be omitted. Also, the embodiments can be changed and combined as needed. The present invention is applied to, for example, a solid-state image capturing apparatus. In addition, however, the present invention is also applicable to a photoelectric conversion apparatus aiming at anything other than image capturing. The present invention can also be used for, for example, an application such as distance measurement or light amount measurement. Some embodiments of the present invention will be described below by taking the solid-state image capturing apparatus as an example.

An example of the arrangement of a solid-state image capturing apparatus 100 according to one embodiment of the present invention will be described with reference to FIGS. 1A and 1B. The solid-state image capturing apparatus 100 is formed by overlaying a substrate S1 shown in FIG. 1A and a substrate S2 shown in FIG. 1B on each other. The substrate S1 includes a pixel array 10. The pixel array 10 includes a plurality of unit cells UNT arranged along a predetermined surface. The plurality of unit cells UNT are arranged so as to form a plurality of rows and a plurality of columns. The pixel array 10 can include the plurality of unit cells UNT which form the first group (for example, odd-numbered columns) and the plurality of unit cells UNT which form the second group (for example, even-numbered columns). Each of the plurality of unit cells UNT includes a photoelectric conversion element. Accordingly, the pixel array 10 can include a plurality of photoelectric conversion elements which form the first group and a plurality of photoelectric conversion elements which form the second group.

The substrate S2 includes, for example, A/D conversion circuits (ADCU) 31 and 32, parallel/serial conversion circuits (PSD) 41 and 42, a vertical scanning circuit 20, a processing circuit (DSP) 70, a timing generation circuit (TG) 80, and a clock generation circuit (CGEN) 90.

The A/D conversion circuit 31 performs A/D conversion on a plurality of signals respectively output from the plurality of unit cells UNT which form the first group of the pixel array 10 to generate a plurality of digital signals. The A/D conversion circuit 32 performs A/D conversion on a plurality of signals respectively output from the plurality of unit cells UNT which form the second group of the pixel array 10 to generate a plurality of digital signals.

The parallel/serial conversion circuit 41 performs parallel/serial conversion on the plurality of digital signals from the A/D conversion circuit 31 to output serial signals. The parallel/serial conversion circuit 42 performs parallel/serial conversion on the plurality of digital signals from the A/D conversion circuit 32 to output serial signals. The parallel/serial conversion circuits 41 and 42 can include horizontal scanning circuits.

The vertical scanning circuit 20 is a driving circuit which generates control signals for driving transfer transistors of the plurality of rows in the pixel array 10. More specifically, the vertical scanning circuit 20 selects (activates) a plurality of control signals corresponding to the plurality of rows, respectively, of the pixel array 10 in a predetermined order. The vertical scanning circuit 20 can include, for example, a scanning circuit (SC) 21 formed by a shift register or the like, and a buffer (BUF) 22 which buffers signals output from the scanning circuit 21 and generates a plurality of control signals.

The processing circuit (DSP) 70 is formed by a digital signal processor, and processes (for example, noise reduction, color processing, correction, or compression) serial signals supplied from the parallel/serial conversion circuits 41 and 42. The timing generation circuit (TG) 80 generates, based on clock signals supplied from the clock generation circuit (CGEN) 90, control signals for controlling the vertical scanning circuit 20, the A/D conversion circuits 31 and 32, the parallel/serial conversion circuits 41 and 42, and the processing circuit 70. The clock generation circuit 90 includes, for example, a DLL (Delay Locked Loop), and generates clock signals which are synchronized with externally supplied clock signals and supplies them to the timing generation circuit 80.

Figure 1B:
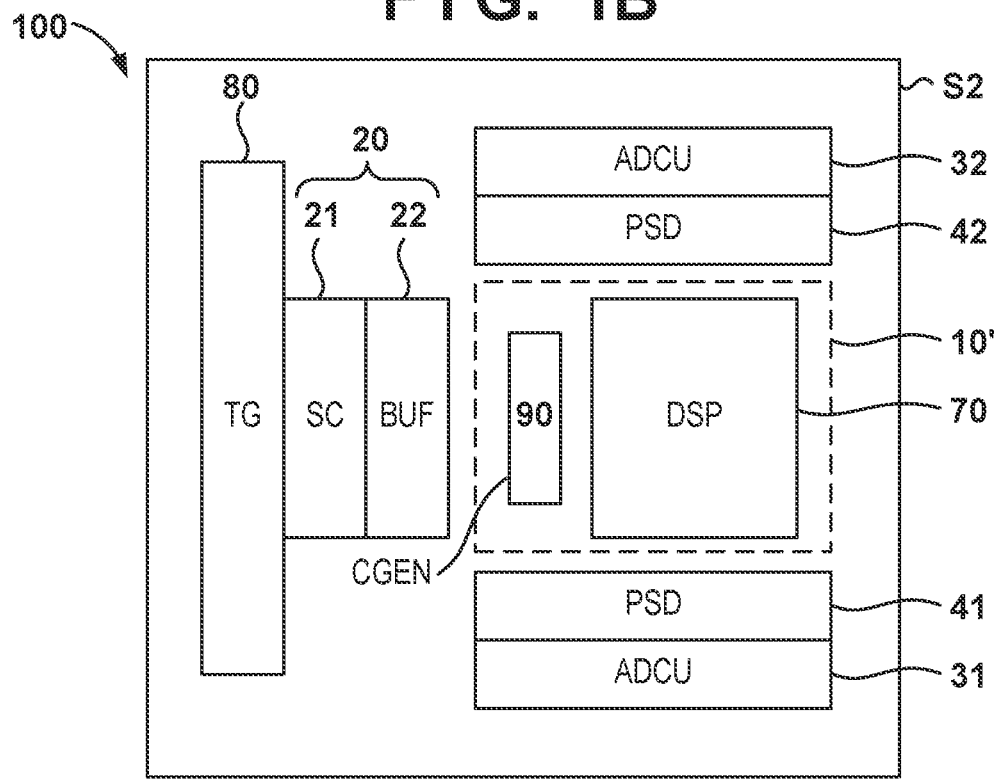

A broken line 10' of FIG. 1B indicates a position of the perimeter of the pixel array 10 when the substrate S1 and the substrate S2 are stacked. As shown in FIG. 1B, at least a part of the pixel array 10 and at least a part of the processing circuit 70 are overlaid. Moreover, at least the part of the pixel array 10 and at least a part of the clock generation circuit 90 are overlaid.

Figure 2:
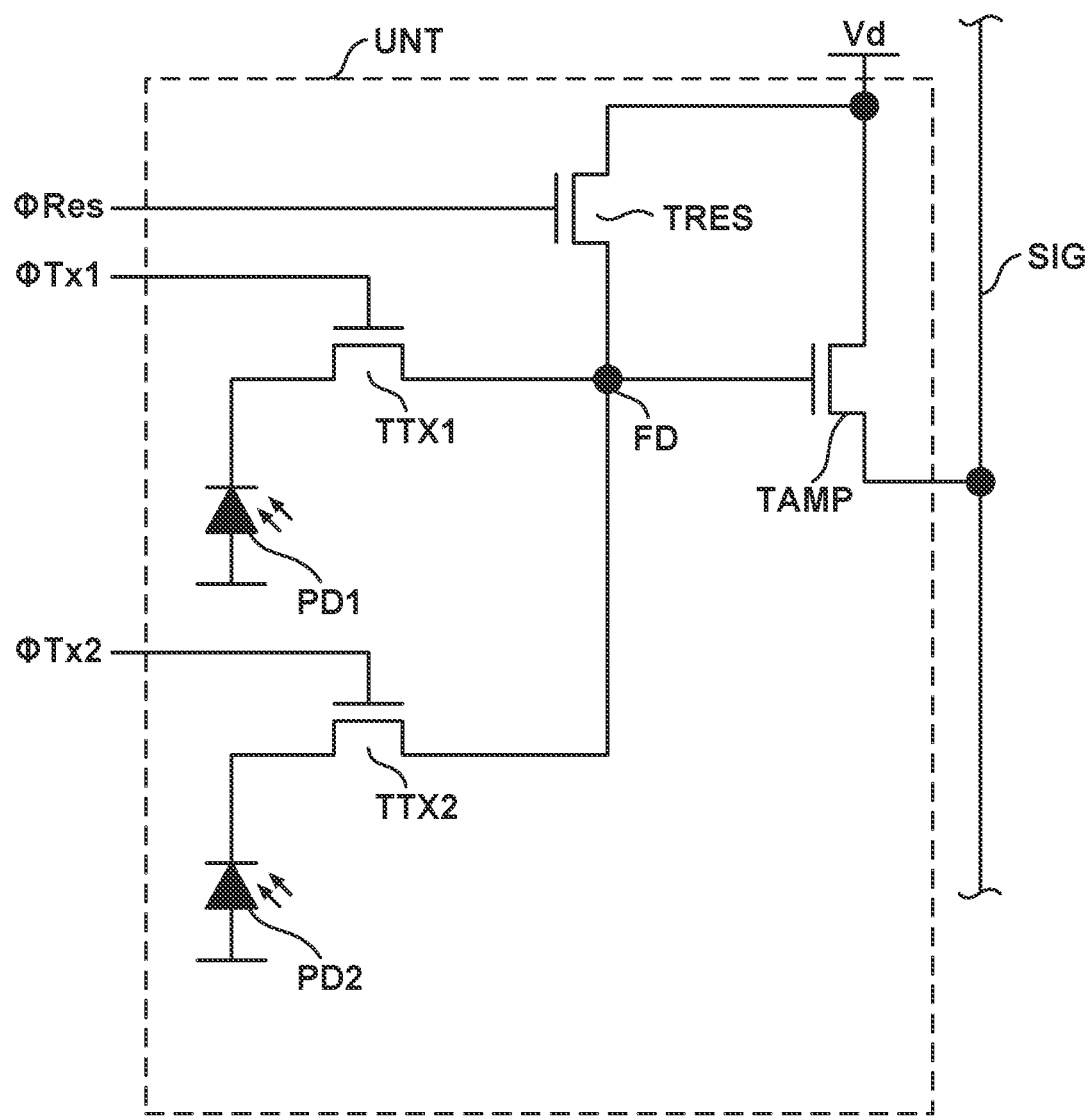
FIG. 2 is an equivalent circuit diagram for explaining an example of a unit cell of the image capturing apparatus in FIGS. 1A and 1B.

The unit cells UNT of FIGS. 1A and 1B will now be described in detail with reference to FIG. 2. FIG. 2 is an equivalent circuit diagram showing one unit cell UNT. The unit cell UNT includes two photoelectric conversion elements PD1 and PD2, two transfer transistors TTX1 and TTX2, a floating diffusion FD, a reset transistor TRES, and an amplification transistor TAMP.

The photoelectric conversion element PD1 is, for example, a photodiode, and generates and accumulates charges corresponding to incident light. Values corresponding to these charges form pixels in an image obtained by the solid-state image capturing apparatus 100. The photoelectric conversion element PD1 is connected to the floating diffusion FD via the transfer transistor TTX1. A control signal ϕTx1 is supplied from the vertical scanning circuit 20 of FIGS. 1A and 1B to the gate of the transfer transistor TTX1. ON/OFF of the transfer transistor TTX1 is switched in accordance with the level of the control signal ϕTx1. When the transfer transistor TTX1 is turned on, a charge signal is transferred from the photoelectric conversion element PD1 to the floating diffusion FD. The transferred charge signal is converted into a voltage signal in the floating diffusion FD. The photoelectric conversion element PD2, the transfer transistor TTX2, and a control signal ϕTx2 are similar to the photoelectric conversion element PD1, the transfer transistor TTX1, and the control signal ϕTx1. In an example of FIG. 2, the two photoelectric conversion elements PD1 and PD2 share the floating diffusion FD. Instead of this, in each unit cell UNT, only one photoelectric conversion element may be connected to one floating diffusion FD, or three or more (for example, four) photoelectric conversion elements may share the floating diffusion FD.

The floating diffusion FD is further connected to a voltage source Vd via the reset transistor TRES. A control signal ϕRes is supplied from the vertical scanning circuit 20 of FIGS. 1A and 1B to the gate of the reset transistor TRES. ON/OFF of the reset transistor TRES is switched in accordance with the level of the control signal ϕRes. When the reset transistor TRES is turned on, the voltage of the floating diffusion FD is reset by a voltage supplied from the voltage source Vd. When the reset transistor TRES is turned off, the voltage of the floating diffusion FD enters a floating state.

The floating diffusion FD is further connected to the gate of the amplification transistor TAMP. One main electrode (for example, the drain) of the amplification transistor TAMP is connected to the voltage source Vd. The other main electrode (for example, the source) of the amplification transistor TAMP is connected to a signal line SIG. The amplification transistor TAMP forms a source follower circuit together with a current source (not shown) connected to the signal line SIG. More specifically, the amplification transistor TAMP amplifies a signal transferred from the photoelectric conversion element PD1 or the photoelectric conversion element PD2 to the floating diffusion FD and transmits the amplified signal to the signal line SIG. A voltage supplied to the reset transistor TRES can take VH and VL serving as a potential lower than VH. The potential of the floating diffusion FD becomes relatively high when the reset transistor TRES is turned on in a state in which VH is supplied. The potential of the floating diffusion FD becomes relatively low when the reset transistor TRES is turned on in a state in which VL is supplied. The pixels enter an unselected state in a state in which the potential is relatively low. The pixels enter a selected state in a state in which the potential is relatively high. A specific pixel can be set in the selected state by thus controlling the potential of the floating diffusion. Instead of this, the specific pixel may be set in the selected state by arranging a selection transistor between the amplification transistor TAMP and the signal line SIG.

Figure 3A:
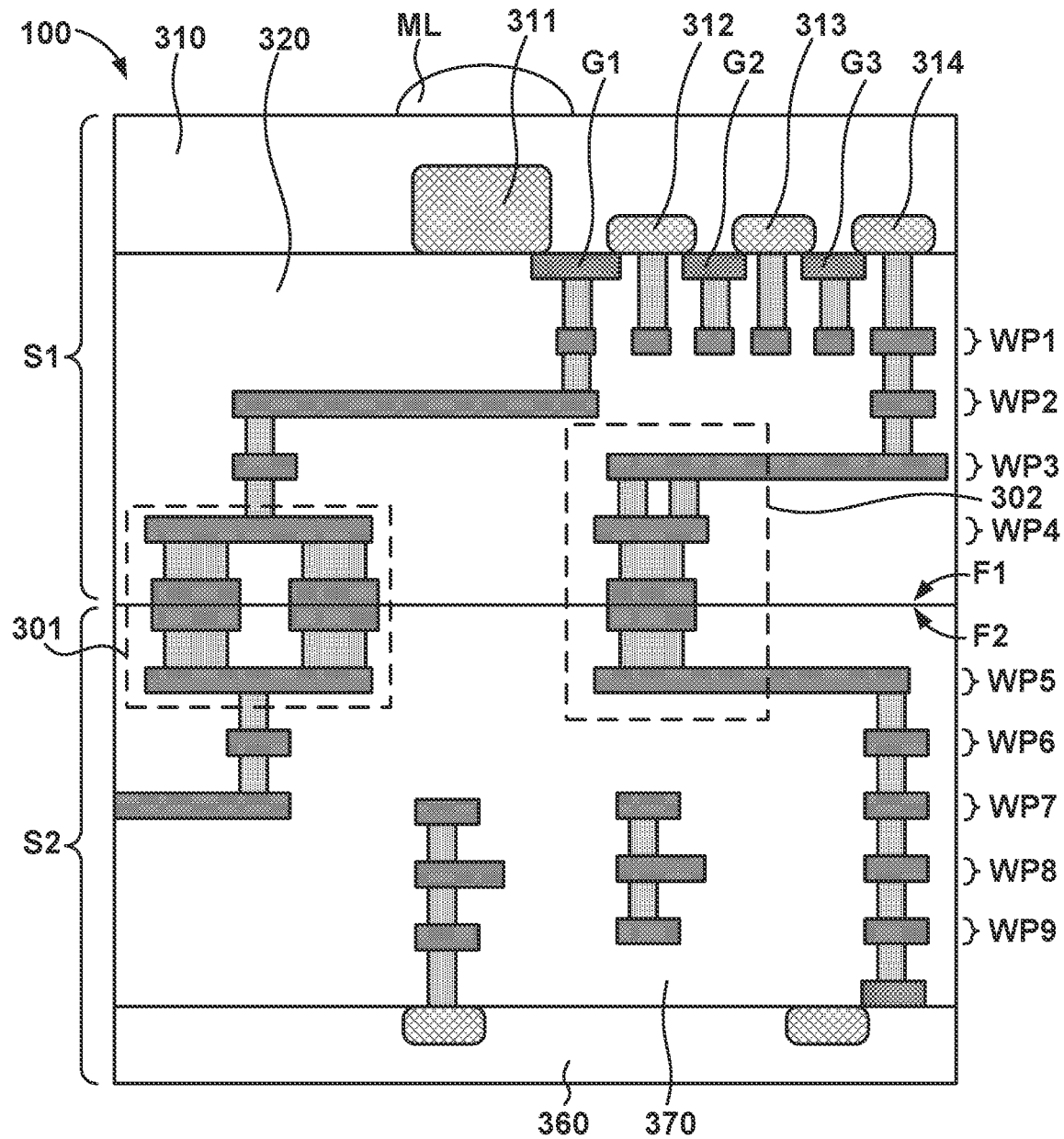
FIGS. 3A to 3C are views for explaining an example of the sectional structure of the image capturing apparatus in FIGS. 1A and 1B.
Figure 3B:
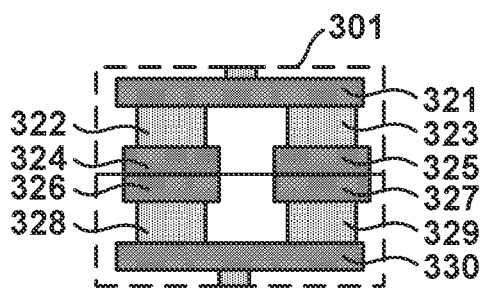
Figure 3C:
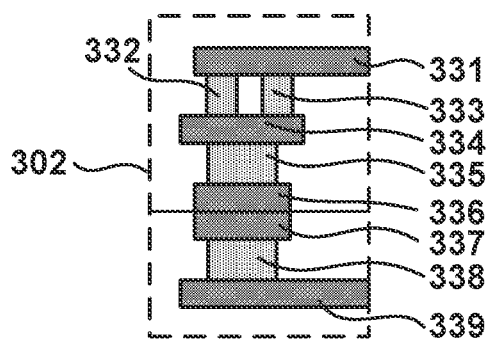

The sectional structure of the solid-state image capturing apparatus 100 in FIGS. 1A and 1B will now be described with reference to FIGS. 3A to 3C. FIGS. 3A to 3C place focus on, of the solid-state image capturing apparatus 100, the structure of each unit cell UNT and the wiring structure for supplying a signal to the gate of the transfer transistor TTX1. FIG. 3B places focus on a portion of FIG. 3A surrounded by a broken line 301. FIG. 3C places focus on a portion of FIG. 3A surrounded by a broken line 302. FIGS. 3A to 3C do not correspond to a two-dimensional layout in each of FIGS. 4A to 4D to be described later in order to give a higher priority to an explanation of the connection relationship among respective elements and the positional relationship among the views in a vertical direction. The substrate S1 and the substrate S2 are overlaid on each other such that one surface F1 (a lower surface in FIG. 3A) of the substrate S1 and one surface F2 (an upper surface in FIG. 3A) of the substrate S2 face each other.

The substrate S1 includes a semiconductor region 310 and an insulator region 320. The semiconductor region 310 is a region mainly formed by a semiconductor such as silicon. The semiconductor region 310 can include an insulator portion such as an element isolation region (not shown). The insulator region 320 is a region mainly formed by an insulator such as silicon oxide or silicon nitride. The insulator region 320 can include conductors such as electrically conductive patterns and plugs to be described later.

The semiconductor region 310 includes impurity regions 311 to 314 on a side close to the surface F1. The impurity region 311 forms the photoelectric conversion element PD1. The impurity region 312 forms the floating diffusion FD. The impurity region 313 forms one main electrode (for example, the drain) of the reset transistor TRES and the other main electrode (for example, the drain) of the amplification transistor TAMP. The impurity region 314 forms the other main electrode (for example, the source) of the amplification transistor TAMP. The solid-state image capturing apparatus 100 includes a microlens ML on a surface of the substrate S1 on a side opposite to the surface F1. The microlens ML is arranged at a position where light from the upper side of FIG. 3A is condensed to the impurity region 311.

The insulator region 320 includes gates G1 to G3 near the interface between the semiconductor region 310 and the insulator region 320. The insulator region 320 further includes a gate insulating film (not shown) between the semiconductor region 310 and the gates G1 to G3. The gate G1 is the gate of the transfer transistor TTX1. The gate G2 is the gate of the reset transistor TRES. The gate G3 is the gate of the amplification transistor TAMP.

The insulator region 320 further includes a plurality of electrically conductive patterns WP1 to WP4 and a plurality of plugs which connect these electrically conductive patterns to each other. In this embodiment, the insulator region 320 includes four electrically conductive patterns. However, the number of electrically conductive patterns may be larger or smaller than this. The electrically conductive pattern WP4 is closest to the surface F1 out of the plurality of electrically conductive patterns WP1 to WP4. The electrically conductive pattern WP3 is the second closest to the surface F1 out of the plurality of electrically conductive patterns WP1 to WP4.

The substrate S2 includes a semiconductor region 360 and an insulator region 370. The semiconductor region 360 is a region mainly formed by a semiconductor such as silicon. The semiconductor region 360 can include an insulator portion such as an element isolation region (not shown). The insulator region 370 is a region mainly formed by an insulator such as silicon oxide or silicon nitride. The insulator region 370 can include conductors such as electrically conductive patterns and plugs to be described later.

The semiconductor region 360 includes, for example, an impurity region of a transistor in each circuit formed in the substrate S2. The insulator region 370 further includes the gate of the transistor, a plurality of electrically conductive patterns WP5 to WP9, and a plurality of plugs which connect these electrically conductive patterns to each other. In this embodiment, the insulator region 370 includes five electrically conductive patterns. However, the number of electrically conductive patterns may be larger or smaller than this. The electrically conductive pattern WP5 is closest to the surface F2 out of the plurality of electrically conductive patterns WP5 to WP9. The electrically conductive pattern WP6 is the second closest to the surface F2 out of the plurality of electrically conductive patterns WP5 to WP9.

The portion surrounded by the broken line 301 will now be described in detail with reference to FIG. 3B. The portion shown in FIG. 3B forms part of a transmission path of a signal supplied from the vertical scanning circuit 20 of FIGS. 1A and 1B to the gate G1 (that is, the gate of the transfer transistor TTX1). The insulator region 320 of the substrate S1 further includes an electrically conductive portion 324 and an electrically conductive portion 325. Each of the electrically conductive portion 324 and the electrically conductive portion 325 forms part of the surface F1 of the substrate S1. In this specification, the electrically conductive patterns are formed inside the insulator regions of the substrates, and an electrically conductive portion which forms part of the outer surface of each substrate is not an electrically conductive pattern. The electrically conductive pattern WP4 includes an electrically conductive portion 321. The electrically conductive portion 321 is electrically connected to the gate G1 of the transfer transistor TTX1. The electrically conductive portion 321 and the electrically conductive portion 324 are electrically connected to each other by a plug 322. The electrically conductive portion 321 and the electrically conductive portion 325 are electrically connected to each other by a plug 323.

The insulator region 370 of the substrate S2 further includes an electrically conductive portion 326 and an electrically conductive portion 327. Each of the electrically conductive portion 326 and the electrically conductive portion 327 forms part of the surface F2 of the substrate S2. The electrically conductive pattern WP5 includes an electrically conductive portion 330. A signal from the vertical scanning circuit 20 is transmitted to the electrically conductive portion 330. The electrically conductive portion 330 and the electrically conductive portion 326 are electrically connected to each other by a plug 328. The electrically conductive portion 330 and the electrically conductive portion 327 are electrically connected to each other by a plug 329.

The electrically conductive portion 324 and the electrically conductive portion 326 are in contact with each other. The electrically conductive portion 324 and the electrically conductive portion 326 form one connecting portion configured to electrically connect the two substrates S1 and S2 to each other. Moreover, the electrically conductive portion 325 and the electrically conductive portion 327 are in contact with each other, and the electrically conductive portion 325 and the electrically conductive portion 327 form another connecting portion configured to electrically connect the two substrates S1 and S2 to each other. As shown in FIG. 3B, the electrically conductive portion 321 and the electrically conductive portion 330 are electrically connected to each other by two separated connecting portions. The number of connecting portions which electrically connect the electrically conductive portion 321 and the electrically conductive portion 330 to each other may be one or the plural number other than two.

The portion surrounded by the broken line 302 will now be described in detail with reference to FIG. 3C. The portion shown in FIG. 3C forms part of a transmission path of a signal supplied from the impurity region 314 (that is, the source of the transfer transistor TTX1) to the processing circuit 70 of FIGS. 1A and 1B.

The insulator region 320 of the substrate S1 further includes an electrically conductive portion 336. The electrically conductive portion 336 forms part of the surface F1 of the substrate S1. The electrically conductive pattern WP3 includes an electrically conductive portion 331. The electrically conductive portion 331 is electrically connected to the impurity region 314, and a signal generated in the photoelectric conversion element PD1 is transmitted to the electrically conductive portion 331. The electrically conductive pattern WP4 includes an electrically conductive portion 334. The electrically conductive portion 331 and the electrically conductive portion 334 are connected to each other by two plugs 332 and 333. The electrically conductive portion 334 and the electrically conductive portion 336 are connected to each other by a plug 335.

The insulator region 370 of the substrate S2 further includes an electrically conductive portion 337. The electrically conductive portion 337 forms part of the surface F2 of the substrate S2. The electrically conductive pattern WP5 includes a signal line 339. The electrically conductive portion 337 and the signal line 339 are electrically connected to each other by a plug 338. The signal line 339 is electrically connected to the A/D conversion circuit 31.

The electrically conductive portion 336 and the electrically conductive portion 337 are in contact with each other. The electrically conductive portion 336 and the electrically conductive portion 337 form one connecting portion configured to electrically connect the two substrates S1 and S2 to each other. The respective electrically conductive portions and plugs shown in FIG. 3C form the same electrical node as the output node (impurity region 314) of the amplification transistor TAMP.

Figure 4A:
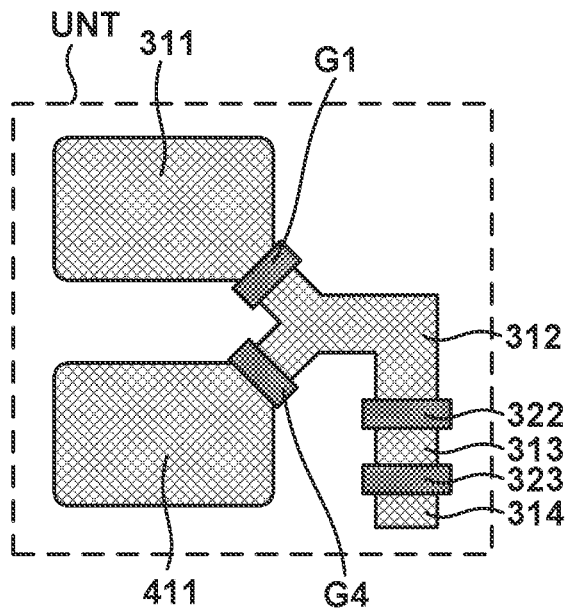
FIGS. 4A to 4D are views for explaining an example of each two-dimensional layout of one substrate of the image capturing apparatus in FIGS. 1A and 1B.
Figure 4B:
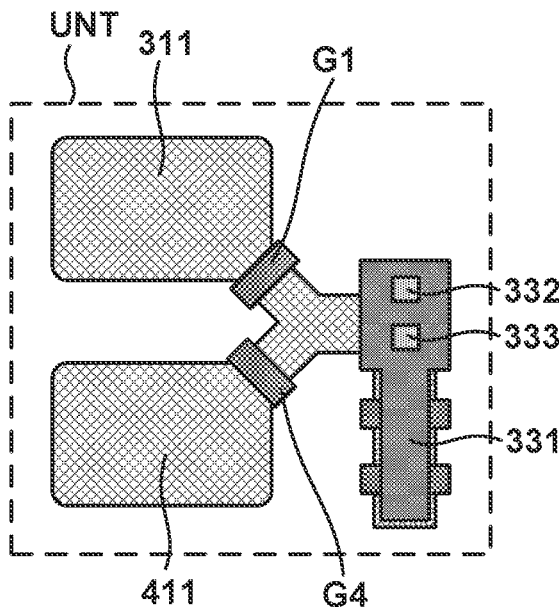
Figure 4C:
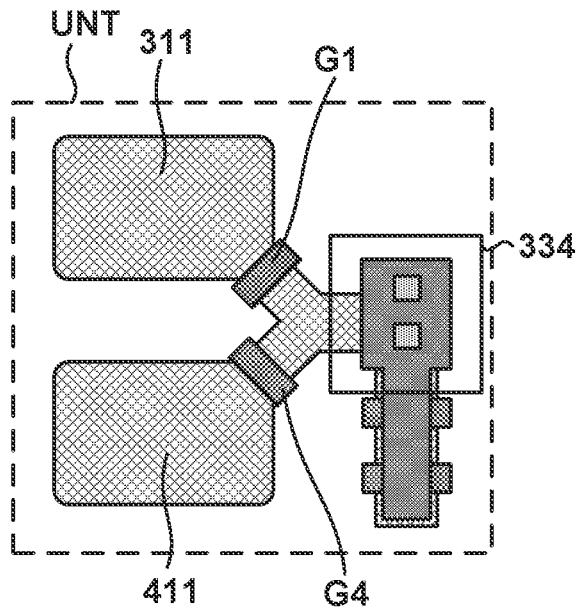

An example of the two-dimensional layout of the unit cell UNT of the solid-state image capturing apparatus 100 in FIGS. 1A and 1B will now be described with reference to each of FIGS. 4A to 4D. Each of FIGS. 4A to 4D shows the layout in a planar view with respect to the surface F1 of the substrate S1. The impurity regions 311 to 314, an impurity region 411, and the gates G1 to G4 are arranged as shown in FIG. 4A. The impurity region 411 forms the photoelectric conversion element PD2. The gate G4 is the gate of the transfer transistor TTX2. FIG. 4B is a view obtained by adding the electrically conductive portion 331, and the plugs 332 and 333 to FIG. 4A. The electrically conductive portion 331 is arranged so as to overlay the impurity regions 312 to 314. FIG. 4C is a view obtained by adding the electrically conductive portion 334 to FIG. 4B. In order to clarify a positional relationship, only the contour of the electrically conductive portion 334 is shown. The electrically conductive portion 334 is arranged so as to overlay the impurity region 312 and the electrically conductive portion 331.

Figure 4D:
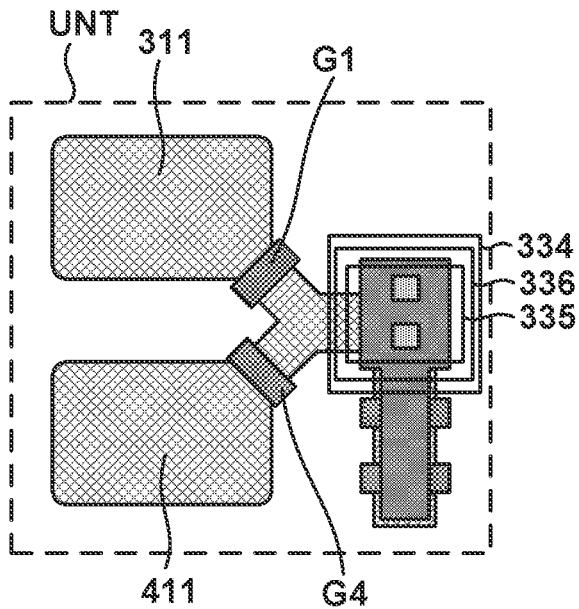

FIG. 4D is a view obtained by adding the electrically conductive portion 336 and the plug 335 to FIG. 4C. In order to clarify a positional relationship, only the contours of the electrically conductive portion 336 and the plug 335 are shown. The electrically conductive portion 336 is arranged so as to overlay the impurity region 312, the electrically conductive portion 331, and the electrically conductive portion 334.

In the planar view with respect to the surface F1 of the substrate S1, the area of the electrically conductive portion 336 is smaller than the area of the electrically conductive portion 334 and larger than the area of a portion of the electrically conductive portion 331 overlaying the electrically conductive portion 334. Further, the area of the electrically conductive portion 334 may become larger than the area of the electrically conductive portion 331 in the planar view with respect to the surface F1 of the substrate S1 by making the electrically conductive portion 334 larger than that shown in each of FIGS. 4A to 4D.

Figure 5A:
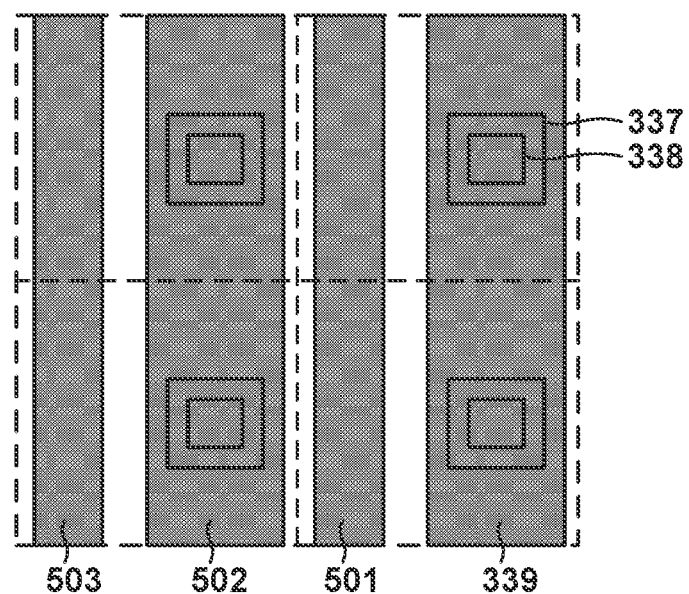
FIGS. 5A and 5B are views for explaining an example of each two-dimensional layout of the other substrate of the image capturing apparatus in FIGS. 1A and 1B.
Figure 5B:
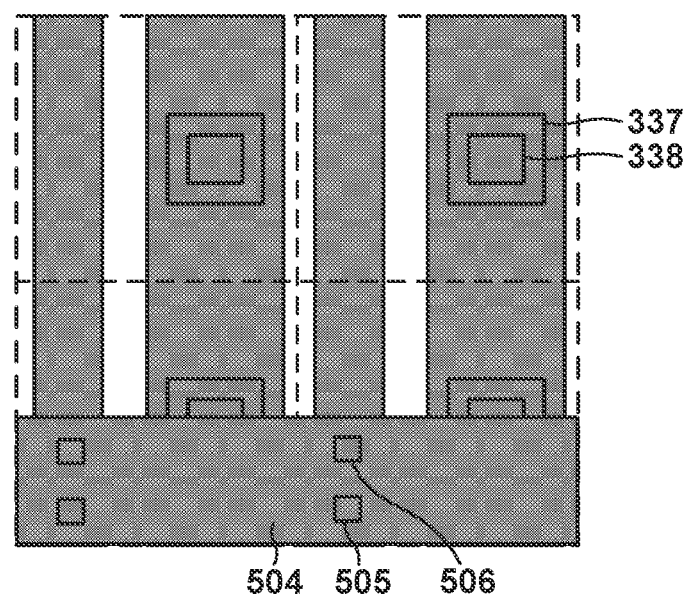

An example of the two-dimensional layout of the substrate S2 at positions corresponding to the unit cells UNT of the solid-state image capturing apparatus 100 in FIGS. 1A and 1B will now be described with reference to FIGS. 5A and 5B. Each of FIGS. 5A and 5B shows the layout in a planar view with respect to the surface F2 of the substrate S2. FIG. 5A shows the two-dimensional layout of the electrically conductive portion 337, the plug 338, and the electrically conductive portion included in the electrically conductive pattern WP5. The electrically conductive portion included in the electrically conductive pattern WP5 includes the signal line 339, a signal line 502, a ground line 501, and a ground line 503. The signal line 339 is electrically connected to the respective electrically conductive portions 331 of the plurality of unit cells UNT arranged in a column direction. Accordingly, signals generated in the photoelectric conversion elements PD1 and PD2 of the plurality of unit cells UNT are transmitted to the signal line 339. A ground voltage is supplied to each of the ground line 501 and the ground line 503.

FIG. 5B is a view obtained by adding an electrically conductive portion 504, a plug 505, and a plug 506 to FIG. 5A. The electrically conductive pattern WP6 includes the electrically conductive portion 504. The plug 505 and the plug 506 are respectively electrically connected to the electrically conductive portion 504 and the ground line 501. As shown in FIG. 5B, the electrically conductive portion 504 extends in a horizontal direction, and is electrically connected to the plurality of ground lines 501 and 503.

In the above-described embodiment, the photoelectric conversion elements PD1 and PD2, the transfer transistors TTX1 and TTX2, the reset transistor TRES, and the amplification transistor TAMP are formed in the substrate S1. Instead of this, at least one of the reset transistor TRES and the amplification transistor TAMP may be formed not in the substrate S1 but in the substrate S2.

In the above-described embodiment, the electrically conductive portion 336 and the electrically conductive portion 334 are connected to each other by the plug 335. Instead of this, the electrically conductive portion 336 and the electrically conductive portion 334 may be connected to each other directly (that is, brought into contact with each other) without using the plug 335. The plugs 322, 323, 328, 329, and 338 may be omitted in the same manner.

As an application of the solid-state image capturing apparatus 100 according to each embodiment described above, a camera in which the solid-state image capturing apparatus 100 is assembled will exemplarily be described below. The concept of the camera includes not only an apparatus mainly aiming at shooting but also an apparatus (for example, a personal computer, a portable terminal, an automobile, or the like) accessorily having a shooting function. The camera may be a module part such as a camera head. The camera includes the solid-state image capturing apparatus 100 according to the present invention exemplified as the above-described embodiments, and a signal processing unit which processes a signal output from this solid-state image capturing apparatus 100. This processing unit can include, for example, a processor which processes digital data based on the signal obtained in the solid-state image capturing apparatus 100. An A/D converter configured to generate this digital data may be provided in a semiconductor substrate of the solid-state image capturing apparatus 100 or another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-131041, filed Jun. 30, 2016, which is hereby incorporated by reference herein in its entirety.

What is claimed is:

1. A photoelectric conversion apparatus comprising:
   a first semiconductor region in which a plurality of pixels are arranged, each pixel including a photoelectric conversion element;
   a second semiconductor region in which a circuit is arranged, the circuit including at least one of a signal processing circuit configured to process a signal based on charges generated in the photoelectric conversion element or a control circuit configured to supply a control signal to the plurality of pixels; and a plurality of connecting portions each including two electrically conductive portions in contact with each other and each electrically connecting the circuit and at least one of the plurality of pixels, wherein the first semiconductor region, the two electrically conductive portions included in one of the plurality of connecting portions, and the second semiconductor region are arranged in such order along a first direction, wherein the plurality of connecting portions include a first number, one or more, of first connecting portions forming a first electrical node, and wherein the plurality of connecting portions include a second number, one or more, of second connecting portions forming a second electrical node, the second number being different from the first number and the second electrical node being electrically separated from the first electrical node.

2. The apparatus according to claim 1, wherein the circuit includes the signal processing circuit, wherein each of the plurality of pixels includes a transistor having a gate for receiving a signal based on charges generated in the photoelectrical conversion element, and wherein the first electrical node is included in a signal path between the transistor and the signal processing circuit.

3. The apparatus according to claim 2, wherein the first number is less than the second number.

4. The apparatus according to claim 2, wherein the second number is less than the first number.

5. The apparatus according to claim 1, wherein the circuit includes the control circuit, and wherein the second electrical node is included in a signal path between the control circuit and one of the plurality of pixels.

6. The apparatus according to claim 5, wherein the first number is less than the second number.

7. The apparatus according to claim 5, wherein the second number is less than the first number.

8. The apparatus according to claim 1, wherein the circuit includes the signal processing circuit and the control circuit, wherein each of the plurality of pixels includes a transistor having a gate for receiving a signal based on charges generated in the photoelectrical conversion element, wherein the first electrical node is included in a signal path between the transistor and the signal processing circuit, and wherein the second electrical node is included in a signal path between the control circuit and one of the plurality of pixels.

9. The apparatus according to claim 8, wherein the first number is less than the second number.

10. The apparatus according to claim 8, wherein the second number is less than the first number.

11. The apparatus according to claim 1, wherein each of the plurality of pixels includes a transistor having a gate for receiving the control signal supplied from the control circuit, and wherein the first electrical node is included in a signal path between the transistor and the control circuit.

12. The apparatus according to claim 11, wherein the first number is less than the second number.

13. The apparatus according to claim 11, wherein the second number is less than the first number.

14. The apparatus according to claim 1, wherein the plurality of connecting portions include at least two of the first connecting portions arranged in a second direction crossing the first direction, and wherein an insulating member is arranged between the at least two of the first connecting portions.

15. The apparatus according to claim 1, wherein the plurality of connecting portions include at least two of the second connecting portions arranged in a second direction crossing the first direction, and wherein an insulating member is arranged between the at least two of the second connecting portions.

16. The apparatus according to claim 1, wherein each of the plurality of connecting portions includes a first plug arranged between the respective connecting portion and the first semiconductor region and a second plug arranged between the respective connecting portion and the second semiconductor region, the first plug being in contact with one of the two electrically conductive portions and the second plug being in contact with the other of the two electrically conductive portions.

17. The apparatus according to claim 1, further comprising:

a first electrically conductive pattern arranged between the plurality of connecting portions and the first semiconductor region and electrically connecting at least one of the plurality of connecting portions and at least one of the plurality of pixels; and a second electrically conductive pattern arranged between the plurality of connecting portions and the second semiconductor region and electrically connecting at least one of the plurality of connecting portions and the circuit.

18. The apparatus according to claim 1, wherein the signal processing circuit includes an analog/digital conversion circuit configured to convert a signal based on charges generated in the photoelectric conversion element into a digital signal.

* * * * *